United States Patent
Fujimoto

[11] Patent Number: 6,081,428
[45] Date of Patent: Jun. 27, 2000

[54] COOLING APPARATUS FOR ELECTRIC DEVICES

[75] Inventor: Akihiro Fujimoto, Meiwa-mura, Japan

[73] Assignee: Advantest Corp., Tokyo, Japan

[21] Appl. No.: 09/041,094

[22] Filed: Mar. 12, 1998

[30] Foreign Application Priority Data

Mar. 19, 1997 [JP] Japan .................................. 9-066636

[51] Int. Cl.$^7$ ...................................................... H05K 7/20
[52] U.S. Cl. ........................ 361/719; 165/80.3; 257/719; 361/705
[58] Field of Search ...................................... 267/150, 158, 267/160; 174/16.3; 165/80.3, 46, 185, 104.33; 257/718, 719, 727; 361/701–706, 710–713, 717–719, 705

[56] References Cited

U.S. PATENT DOCUMENTS

| | | |
|---|---|---|
| 4,381,032 | 4/1983 | Cutchaw . |
| 4,612,978 | 9/1986 | Cutchaw . |
| 4,729,060 | 3/1988 | Yamamoto . |
| 5,515,912 | 5/1996 | Daikoku . |
| 5,705,850 | 1/1998 | Ashiwake . |

*Primary Examiner*—Gerald Tolin
*Attorney, Agent, or Firm*—Muramatsu & Associates

[57] ABSTRACT

A cooling apparatus for cooling a plurality of electric devices mounted on a printed circuit board with high cooling efficiency and low cost. The cooling apparatus includes a cooling plate for receiving heat generated by said electric devices and transmitting the heat to an external area to cool the electric devices, an elastic sheet made of electrically insulating material and attached to the cooling plate for contacting surfaces of the electric devices, means for attaching the elastic sheet to the cooling plate in a manner to form a closed space therebetween, heat conductive springs provided in the closed space for pressing the elastic sheet toward the surfaces of the cooling plate, a heat distribution sheet provided between the elastic sheet and the heat conductive springs to distribute the heat received from the elastic sheet throughout the heat distribution sheet, and a layer of heat conductive grease applied between the heat distribution sheet and the heat conductive springs.

8 Claims, 6 Drawing Sheets

COOLING APPARATUS FOR ELECTRIC DEVICES

FIELD OF THE INVENTION

This invention relates to a cooling apparatus, and more particularly, to a cooling apparatus for effectively cooling a large number of heat generating devices such as electric devices mounted on a printed circuit board.

BACKGROUND OF THE INVENTION

In a system having a large number of heat generating devices, such as electronic devices, a cooling apparatus must be provided in the system to maintain the performance of the electronic devices. For example, a large scale electronic system such as a semiconductor device test system has a large number of electronic devices, i.e., VLSI and LSI circuits. Because of the increase in density and speed of the recent electronic devices, heat dissipated from the electronic devices are increasing. Examples of devices which generate a large amount of heats are ECL gate arrays, general purpose CMOS LSIs, power supply modules, and the like.

As shown in FIG. 6, electronic devices are usually mounted on a printed circuit board in the test system. Since the electronic devices are becoming smaller and smaller, a large number of electronic devices are mounted in a small area of the printed circuit board, which further increases the overall amount of heat generated by the devices.

Life times of semiconductor devices such as LSIs and gate arrays are dependent upon inner temperature (junction temperature) of the semiconductor devices. The higher the temperature, the shorter the life times become. Therefore, the semiconductor devices must be cooled to maintain the junction temperature lower than, for example, 80° C. The present invention is directed to a cooling apparatus for heat generating electric devices.

As noted above, semiconductor devices are mounted on a printed circuit board. Packages of semiconductor devices which dissipate large amount of heat are made of materials of high thermal conductivity such as ceramic. The packages of the semiconductor devices are provided with a large number of electrode pins of various types. For example, a BGA (Ball Grid Array) package has ball shaped pins so that the package is surface mounted on a printed circuit board. Semiconductor devices mounted on a printed circuit board have differences in height because of the differences in size or mounting conditions. For example, 100 LSI devices mounted on a printed circuit board of 380 mm by 450 mm, there are differences of ±1 mm in the height among the devices. Thus, a cooling apparatus for a large number of semiconductor devices must have capability of efficiently cooling the devices having differences in height.

FIGS. 4 and 5 show examples of cooling apparatuses in the conventional technology. The example of FIG. 4 includes nozzles 26, exhaust means 22, elastic heat conductors 25, heat conductor plates 24, and metallic bellows 23. Electric devices 12, which are heat generating devices, are mounted on a printed circuit board 10 while establishing electric contact therebetween through pins 13. The elastic heat conductors 25 are arranged on the electric devices 12 to establish mechanical contact therebetween. The heat conductor plate 24 is provided between the bellows 23 and the elastic heat conductor 25.

Cooling medium, such as cooling fluid, is ejected from the nozzles 26 toward inner spaces formed by the bellows 23 and the heat conductors 24. The used cooling medium is exhausted through the exhaust means 22. Hence, the heat generated by the electric devices 12 are transmitted to the heat conductor plates 24 through the elastic heat conductors 25. The heat is then carried away by the cooling medium through the exhaust means 22. This example of cooling apparatus using the metallic bellows and cooling medium has disadvantages in that an overall cost is high and it is difficult to decrease an overall size.

The example of cooling apparatus shown in FIG. 5 includes a cooling plate 30 having cooling medium paths 31 and heat conductive springs 60. The heat conductive springs 60 are placed between the cooling plate 30 and the electric devices 12 mounted on the printed circuit board 10. Since the spring 60 mechanically contact with both the electric devices 12 and the cooling plate 30, the heat from the electric devices 12 is transmitted to the cooling plate 30. The heat is then carried away by the cooling medium flowing through the paths in the cooling plate 30.

The example of FIG. 5 using the heat conductive springs 60 and cooling plate 30 has a disadvantage wherein electric insulation between the electric devices and the cooling apparatus is insufficient. The cooling efficiency and electric insulation will be improved by providing thermal conductive grease on the contact surfaces of the electric devices 12 and the cooling plate 30 as well as heat conductive springs 60 to reduce thermal resistance among the members. However, the oil in the heat conductive grease will evaporate because of the heat. Thus, the heat transmission and electric insulation effects will be diminished.

As explained above, the cooling apparatus using the metallic bellows 23 and the cooling medium has a difficulty in reducing the size and cost. The cooling apparatus using the heat conductive spring 60 and the cooling plate 30 cannot be used for cooling the electric devices having power sources or electrodes exposed to an atmosphere because the cooling apparatus does not have the insulation capability. Moreover, the evaporation of oil in the heat conductive grease due to the high temperature causes degradation of heat conductive effects as well as contamination in inside and outside of the semiconductor test system.

SUMMARY OF THE INVENTION

Therefore, it is an object of the present invention to provide a cooling apparatus for electric devices which has a high cooling effect in cooling a plurality of heat generating electric devices mounted on the printed circuit board.

It is another object of the present invention to provide a cooling apparatus for electric devices which is capable of achieving electrically insulation between the electric devices and the cooling apparatus.

It is a further object of the present invention to provide a cooling apparatus for electric devices which is able to overcome differences in height of the electric devices and to uniformly receive and transfer the heat from the electric devices.

It is a further object of the present invention to provide a cooling apparatus for electric devices which is able to maintain the same cooling performance for the electric devices for a long period.

The cooling apparatus of the present invention for cooling a plurality of electric devices mounted on a printed circuit board includes a cooling plate for receiving heat generated by the electric devices and transmitting the heat to an external area to cool the electric devices, an elastic sheet made of electrically insulating material for contacting surfaces of the electric devices, means for attaching the elastic sheet to the cooling plate in a manner to form a closed space therebetween, heat conductive springs provided in the closed space for pressing the elastic sheet toward the surfaces of the electric devices and transmitting the heat to the cooling plate, and a first layer of heat conductive grease applied between the cooling plate and the heat conductive springs.

In a further aspect of the present invention, the cooling apparatus further includes a heat distribution sheet provided between the elastic sheet and the heat conductive springs to distribute the heat received from the elastic sheet throughout the heat distribution sheet, and a second layer of heat conductive grease applied between the heat distribution sheet and the heat conductive springs.

According to the present invention, the heat generated by the electric devices are effectively transmitted to the cooling plate even when differences in height of the surfaces of the electric devices exist because of the elastic sheet and the heat conductive springs. Since the elastic sheet for contacting the surfaces of the electric devices is made of insulation material, sufficient insulation can be established between the electric devices to be cooled and the cooling apparatus of the present invention.

The cooling apparatus of the present invention forms a closed space by the cooling plate and the elastic material. The heat conductive springs and the heat conductive grease are provided within the closed space. Thus, the oil of the heat conductive grease is confined within the closed space and is not evaporated, which can maintain the cooling effect for a long period of time. In a further aspect of the present invention, the heat distribution sheet is incorporated to distribute the heat therethrough. Thus, the heat is uniformly transmitted through a large number of heat conductive springs toward the cooling plate, which further improves an overall thermal conductivity of the cooling apparatus.

DETAILED DESCRIPTION OF THE PREFERRED EMBODIMENT

Figure 1:
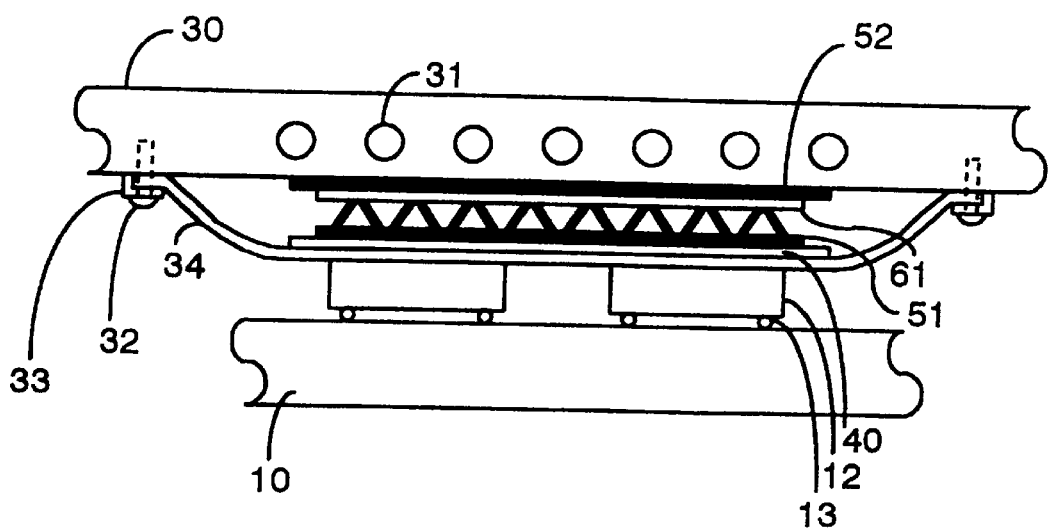
FIG. 1 is a cross sectional view taken by an A—A line of FIG. 7 for showing a structure of the cooling apparatus of the present invention.
Figure 7:
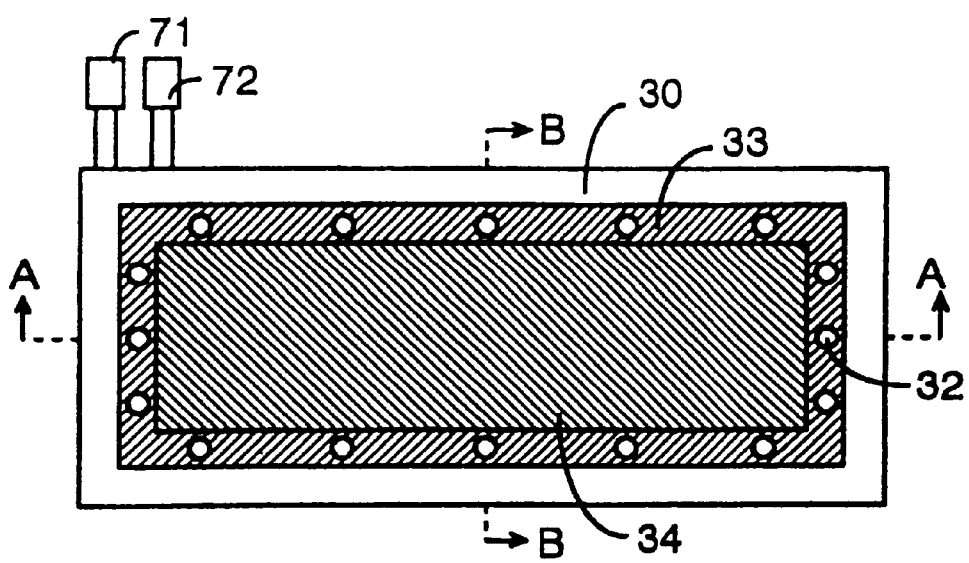
FIG. 7 is a plan view showing the cooling apparatus of the present invention.
Figure 8:
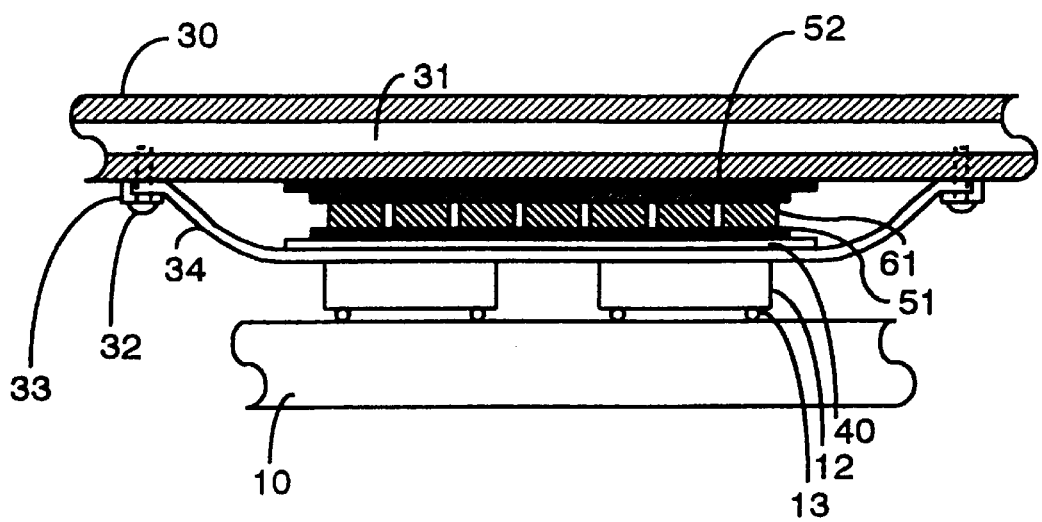
FIG. 8 is a cross sectional view taken by a B—B line of FIG. 7 for showing a structure of the cooling apparatus of the present invention.

The preferred embodiment of the present invention is explained with reference to FIGS. 1–3, 7 and 8. FIG. 7 is a plan view showing the cooling apparatus of the present invention. FIG. 1 is a cross sectional view taken by an A—A line of FIG. 7 and FIG. 8 is a cross sectional view taken by a B—B line of FIG. 7. As shown in FIG. 1, the cooling apparatus of the present invention is formed with an elastic sheet 34, a heat distribution sheet 40, heat conductive springs 61, a cooling plate 30, heat conductive grease 51 and 52, attachment members 33 and screws 32.

The cooling plate 30 has cooling medium paths 30 and an inlet 71 and an outlet 72 through which a cooling medium such as cooling gas or fluid flows to lower the temperature of the cooling plate 30. A plurality of heat generating electric devices 12 such as semiconductor devices are mounted on a printed circuit board 10 through contact pins 13. The elastic sheet 34 is placed on the upper surfaces of the electric devices 12. An example of the elastic sheet 34 is a silicon rubber sheet which is well known and commonly used in the industry. The elastic sheet 34 is attached to the cooling plate 30 by means of the attachment members 33 and the screws 32. Thus, as shown in FIGS. 1 and 8, a closed space is formed by the elastic sheet 34 and the cooling plate 30.

Within the closed space, the heat distribution sheet 40 is placed on the inner surface of the elastic sheet 34. The heat conductive grease 51 is provided on the heat distribution sheet 40. The heat conductive grease 52 is also applied to the bottom surface of the cooling plate 30. Between the heat conductive grease 51 and 52, the heat conductive springs 61 are provided for pressing the elastic sheet 34 and the cooling plate 30 outward. The cooling apparatus structured in this manner is pressingly placed on the surfaces of the electric devices 12.

The elastic sheet 34 is made of a sheet of 0.5–1.0 mm thickness that has sufficient elasticity and electric insulation characteristics. Because of this elasticity, the elastic sheet 34 can absorb the variation of height of the electric devices 12. In other words, the elastic sheet 34 can contact all of the surfaces of the electric devices 12 and sufficiently transfer the heat even when the differences in the height of the heat generating devices exist. Due to the small thickness, the elastic sheet 34 has a relatively small heat resistance in a direction which is perpendicular to the surface thereof. Thus, the heat from the surfaces of the electric devices 12 is effectively transmitted to the heat distribution sheet 40 while maintaining the electrical insulation between the cooling apparatus and the electric devices 12.

The heat distribution sheet 40 consists of a metal sheet and has high thermal conductivity. The thickness of the heat distribution sheet 40 is, for example, about 100 micrometer. The heat distribution sheet 40 has a sufficient size to contact all of the heat conductive springs 61. The heat received from the elastic sheet 34 is distributed throughout the heat distribution sheet 40.

Figure 2:
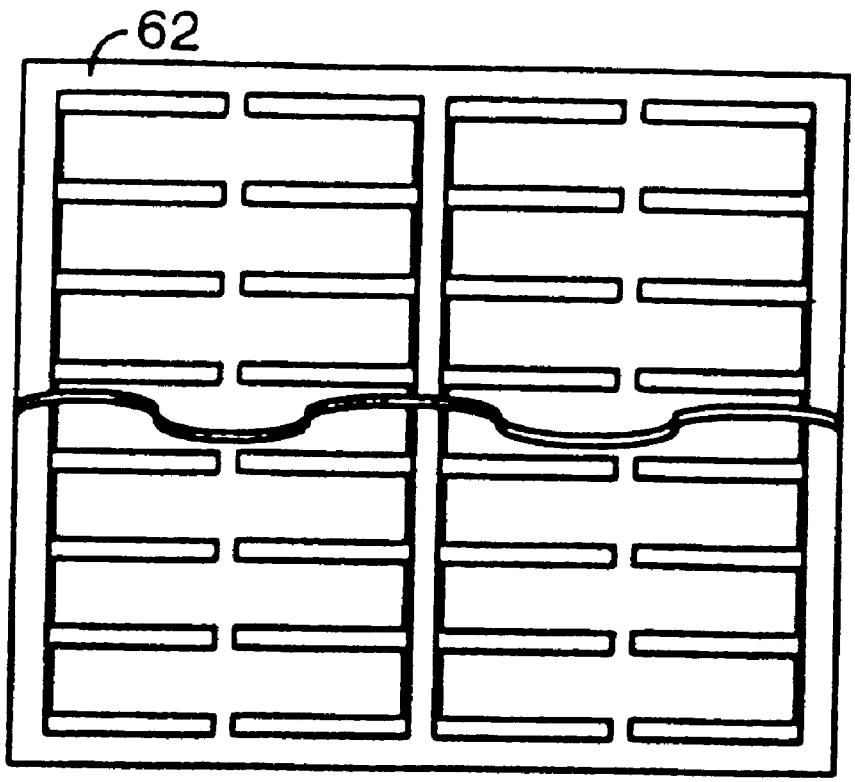
FIG. 2 is a schematic diagram showing a partial view of heat conductive springs before a bending processing.
Figure 3:
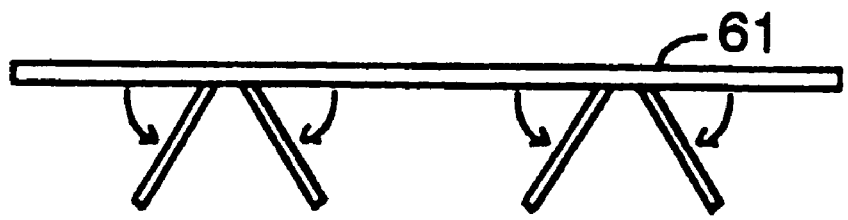
FIG. 3 is a schematic diagram showing a front view of the heat conductive springs.
Figure 4:
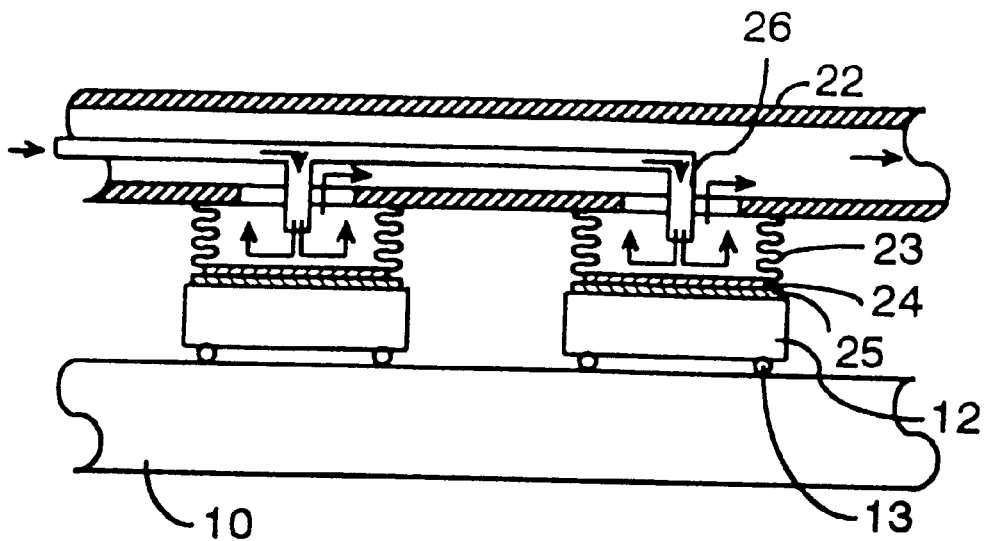
FIG. 4 is a cross sectional view of a first example of cooling apparatus in the conventional technology.
Figure 5:
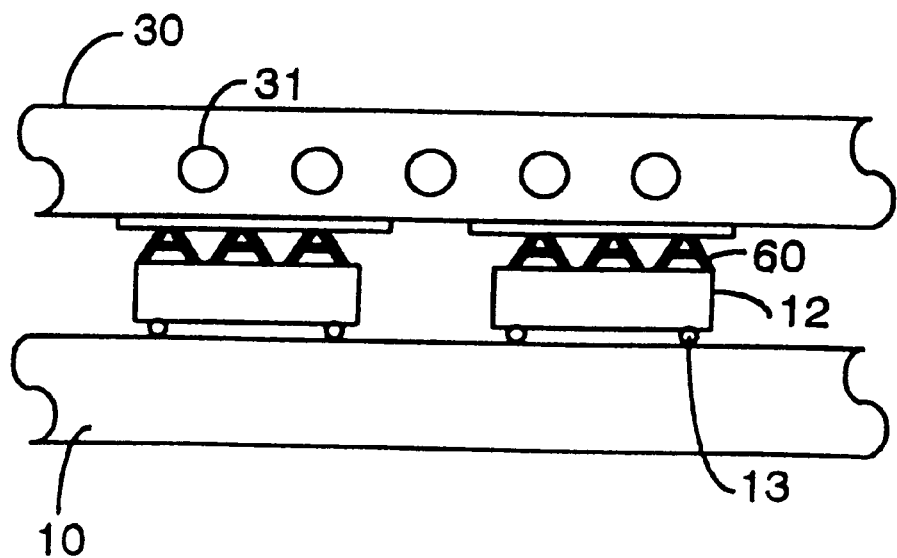
FIG. 5 is a cross sectional view of a second example of cooling apparatus in the conventional technology.
Figure 6:
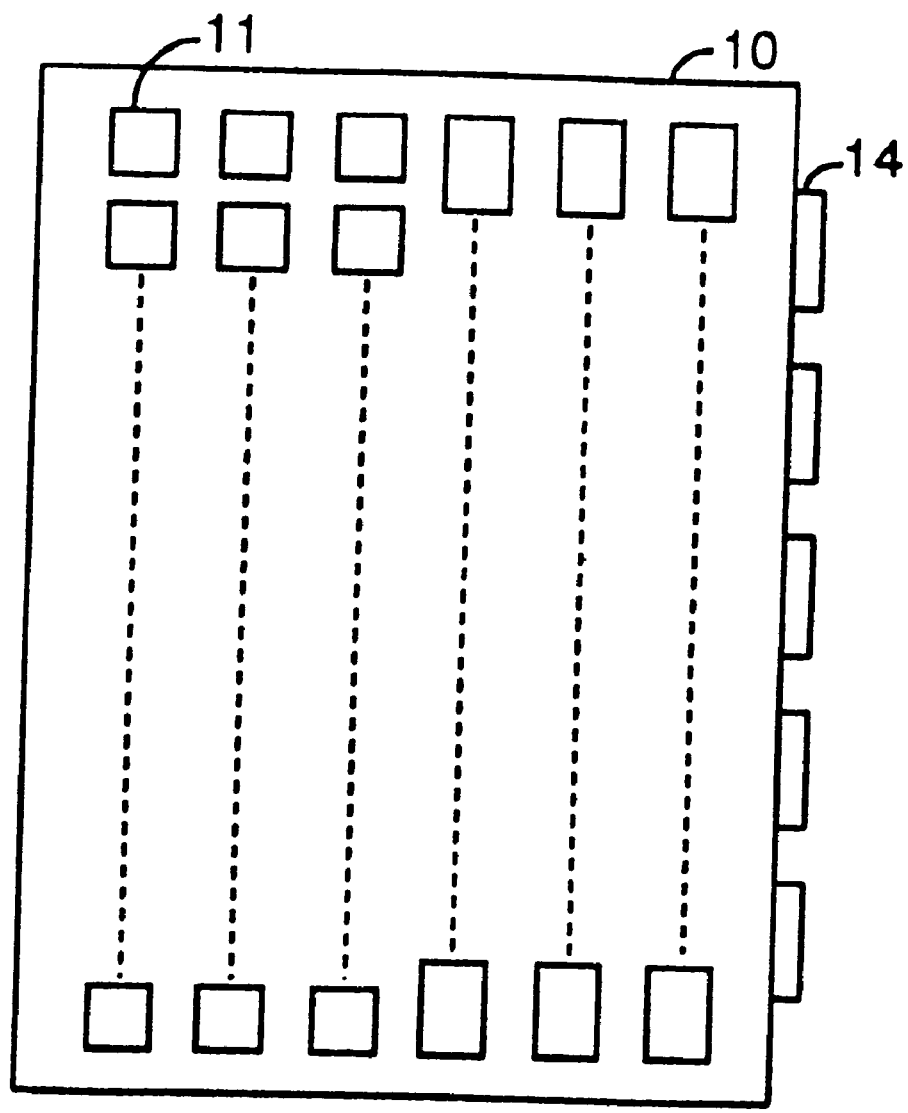
FIG. 6 is a schematic diagram showing a printed circuit board for mounting a large number of electric devices thereon.

As shown in FIG. 2, the heat conductive springs 61 before undergoing a bending processing is made of a metal sheet 62 through an etching process. The metal sheet 62 is made of elastic metal material such as beryllium copper (Be—Cu) with thickness of several ten micrometer. The heat conductive springs 61 are formed in a shape as shown in FIG. 3 having bent angle of about 45 degrees formed through the bending process and are provided with a heat hardening processing to maintain the spring forces.

Each of the heat conductive springs 61 has a spring force created by the bending process which functions toward the electric devices 12. Because of the spring force of the spring 61, irregularity of height of the electric devices 12 can be absorbed. Thus, the heat dissipated by the electric devices 12 is uniformly received by the cooling apparatus of the present invention. Since they are made of metal, the heat conductive springs 61 have high thermal conductivity through which the heat is transferred to the cooling plate 30 via the heat conductive grease 52.

The heat conductive grease 51 applied between the heat distribution sheet 40 and the heat conductive springs 61, and the heat conductive grease 52 applied between the cooling plate 30 and the heat conductive springs 61 have thickness of about 100 micrometer. Each of the heat conductive grease 51 and 52 improves mechanical contact between two members and thus reduces thermal resistance. As shown in FIGS. 1, 7 and 8, since the periphery of the elastic sheet 34 is fixed to the cooling plate 30 through the attachment members and the grease 51 and 52 is within the closed space formed in this manner, the oil of the grease 51 and 52 will not be evaporated or reduced. Thus, the performance of the grease 51 and 52 will not be deteriorated even by the long use of the cooling apparatus.

The heat distribution sheet 40 in the above embodiment improves the thermal conductivity of the cooling apparatus by distributing the heat throughout the sheet. Since the heat is distributed in the heat conductive sheet, a large number of the heat conductive springs 61 can participate in receiving the heat from the sheet 40 and transferring the heat to the cooling plate 30. However, the heat distribution sheet can be obviated from the cooling apparatus when the heat transfer through limited springs 61 is satisfactory or the electric devices 12 are aligned close together.

In the cooling apparatus of the present invention described above, the heat generated by the electric devices 12 is transferred as follows. The heat from the surfaces of the electric devices 12 is transmitted to the heat distribution sheet 40 through the elastic sheet 34 while maintaining the electrical insulation between the cooling apparatus and the electric devices 12. The heat received from the elastic sheet 34 is distributed throughout the heat distribution sheet 40. The heat conductive springs 61 receive the heat from the heat distribution sheet 40 via the heat conductive grease 51 and transfer the heat to the cooling plate 30 via the heat conductive grease 52. The cooling medium flowing through the cooling plate transfers the heat to outside.

As described in the foregoing, according to the cooling apparatus of the present invention, the heat generated by the electric devices are effectively transmitted to the cooling plate even when differences in height of the surfaces of the electric devices exist because of the elastic sheet and the heat conductive springs. Since the elastic sheet for contacting the surfaces of the electric devices is made of insulation material, sufficient insulation can be established between the electric devices to be cooled and the cooling apparatus of the present invention.

The cooling apparatus of the present invention forms a closed space by the cooling plate and the elastic material. The heat conductive springs and the heat conductive grease are provided within the closed space. Thus, the oil of the heat conductive grease is confined within the closed space and will not evaporated, which can maintain the cooling effect for a long period. In a further aspect of the present invention, the heat distribution sheet is incorporated to distribute the heat therethrough. Thus, the heat is uniformly transmitted through a large number of heat conductive springs, which further improves an overall thermal conductivity of the cooling apparatus.

What is claimed is:

1. A cooling apparatus for cooling a plurality of electric devices mounted on a printed circuit board, comprising:

a cooling plate positioned over said printed circuit board for receiving heat generated by said electric devices and transmitting the heat to an external area to cool said electric devices;

an elastic sheet made of electrically insulating material and attached to a bottom surface of said cooling plate for contacting with upper surfaces of said electric devices;

means for attaching said elastic sheet to said cooling plate in a manner to form a closed space therebetween;

heat conductive springs provided within said closed space for pressing said elastic sheet toward said surfaces of said electric devices and transmitting said heat to said cooling plate when said cooling apparatus is placed on said printed circuit board;

a heat distribution sheet provided between said elastic sheet and said heat conductive springs to distribute said heat received from said elastic sheet throughout said heat distribution sheet; and a first layer of heat conductive grease applied between said heat distribution sheet and said heat conductive springs.

2. A cooling apparatus as defined in claim 1, further comprising:

a second layer of heat conductive grease applied between said cooling plate and said heat conductive springs.

3. A cooling apparatus as defined in claim 1, wherein said cooling plate has cooling medium paths for flowing cooling medium therethrough.

4. A cooling apparatus as defined in claim 1, wherein said heat conductive springs are made of metal having high thermal conductivity.

5. A cooling apparatus as defined in claim 1, wherein said heat distribution sheet is made of metal having high thermal conductivity.

6. A cooling apparatus for cooling a plurality of electric devices mounted on a printed circuit board, comprising:

a cooling plate provided over said printed circuit board for receiving heat generated by said electric devices and transmitting the heat to an external area to cool said electric devices, said cooling plate having cooling medium paths for flowing cooling medium therethrough;

an elastic sheet having thickness of about 0.5–1.0 mm and connected to a bottom surface of said cooling plate, said elastic sheet being made of electrically insulating material for contacting with upper surfaces of said electric devices;

means for attaching said elastic sheet to said cooling plate in a manner to form a closed space therebetween;

heat conductive springs provided within said closed space for pressing said elastic sheet toward said surfaces of said electric devices and transmitting said heat to said cooling plate when said cooling apparatus is placed on said printed circuit board;

a first layer of heat conductive grease applied between said heat distribution sheet and said heat conductive springs;

a heat distribution sheet provided between said elastic sheet and said heat conductive springs to distribute said heat received from said elastic sheet throughout said heat distribution sheet; and a second layer of heat conductive grease applied between said cooling plate and said heat conductive springs.

7. A cooling apparatus as defined in claim 6, wherein said cooling plate has cooling medium paths for flowing cooling medium therethrough.

8. A cooling apparatus as defined in claim 6, wherein said heat conductive springs are made of metal having high thermal conductivity.

* * * * *